US010461080B2

(12) United States Patent
Lee et al.

(10) Patent No.: US 10,461,080 B2
(45) Date of Patent: Oct. 29, 2019

(54) METHOD FOR MANUFACTURING A FINFET DEVICE

(71) Applicant: TAIWAN SEMICONDUCTOR MANUFACTURING CO., LTD., Hsinchu (TW)

(72) Inventors: Shen-Nan Lee, Hsinchu County (TW); Kuo-Yin Lin, Hsinchu County (TW); Pin-Chuan Su, Hsinchu (TW); Teng-Chun Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/053,990

(22) Filed: Aug. 3, 2018

(65) Prior Publication Data

US 2019/0164963 A1 May 30, 2019

Related U.S. Application Data

(60) Provisional application No. 62/593,142, filed on Nov. 30, 2017.

(51) Int. Cl.

| | |
|---|---|
| *H01L 27/088* | (2006.01) |
| *H01L 21/8238* | (2006.01) |
| *H01L 27/12* | (2006.01) |
| *H01L 29/78* | (2006.01) |
| *H01L 29/08* | (2006.01) |
| *H01L 29/10* | (2006.01) |
| *H01L 29/165* | (2006.01) |
| *H01L 29/06* | (2006.01) |

(52) U.S. Cl.
CPC .. *H01L 27/0886* (2013.01); *H01L 21/823821* (2013.01); *H01L 27/12* (2013.01); *H01L 29/0642* (2013.01); *H01L 29/0847* (2013.01); *H01L 29/1054* (2013.01); *H01L 29/165* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 2015/0126008 A1* | 5/2015 | Paul | H01L 21/823431 438/283 |
| 2016/0027777 A1* | 1/2016 | Eneman | H01L 29/1054 257/192 |
| 2016/0268394 A1* | 9/2016 | Hur | H01L 21/02532 |

* cited by examiner

*Primary Examiner* — Asok K Sarkar
(74) *Attorney, Agent, or Firm* — Maschoff Brennan

(57) ABSTRACT

A method for manufacturing a semiconductor device is provided. In the method for manufacturing a semiconductor device, at first, a semiconductor substrate of a wafer is etched to form at least one fin. Then, an insulation structure is formed around the fin. Thereafter, the fin is recessed. Then, an epitaxial channel structure is epitaxially grown over the recessed fin. Thereafter, a portion of the epitaxial channel structure over a top surface of the insulation structure is removed. Then, a non-contact-type cleaning operation is performed to clean a top surface of the wafer after removing said portion of the epitaxial channel structure. Thereafter, the top surface of the wafer is cleaned using hydrogen fluoride after removing said portion of the epitaxial channel structure. Then, the insulation structure is recessed, such that the epitaxial channel structure protrudes from the recessed insulation structure.

20 Claims, 18 Drawing Sheets

METHOD FOR MANUFACTURING A FINFET DEVICE

RELATED APPLICATION

This application claims the benefit of the Provisional Applications Ser. No. 62/593,142, filed Nov. 30, 2017. The entire disclosures of all the above applications are hereby incorporated by reference herein.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For example, wafer cleaning processes are performed throughout the fabrication process of an IC. However, the conventional cleaning processes have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
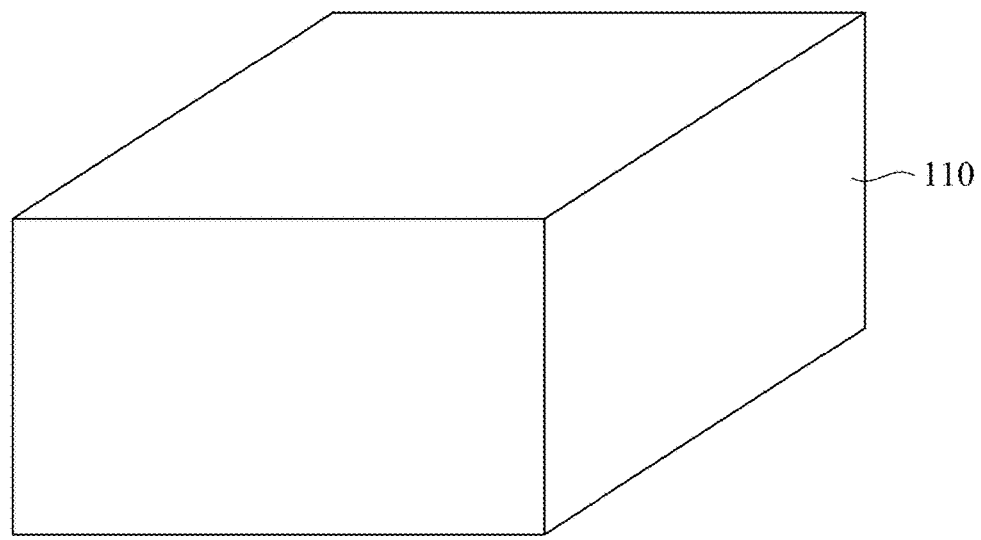
FIG. 1A to FIG. 1L are schematic structure diagrams of intermediate stages showing a method for manufacturing a FinFET device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

The FinFET may be patterned by any suitable method. For example, the FinFET may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the FinFET.

A surface of an epitaxial channel structure is normally hydrophobic. When a typical chemical mechanical polish (CMP) operation is conducted on the epitaxial channel structure, extra wetting agents or surfactants are added into CMP slurry or post clean chemicals to form hydrophilic surface. However, these wetting agents and surfactants are all organic compounds which could induce visible or non-visible polymer residues and organic fall-on particles on the epitaxial structure. These visible or non-visible polymer residues and organic fall-on particles could severe impact device performance or product yield.

A typical post CMP cleaner only provides a sponge brush, rollers, or a pencil to directly contact the surface of the epitaxial channel structure with one typical clean chemical to reduce surface defect counts. However, the clean efficiency by using the contact-type clean with single chemical clean is not enough for post CMP applications of the epitaxial channel structure.

Embodiments of the present disclosure are directed to a method for manufacturing a FinFET device. In the method for manufacturing a FinFET device, a semiconductor substrate is provided. Then, an epitaxial channel structure is formed on the semiconductor substrate. Thereafter, a polish operation is conducted on the epitaxial channel structure. Then, an integrated in-situ chemical clean operation is conducted on exposed (polished) surfaces of the epitaxial channel structure to clean the exposed surfaces of the epitaxial channel structure. Thereafter, a gate dielectric layer and a gate electrode layer are sequentially formed on the epitaxial channel structure. Then, sources/drains are formed on the epitaxial channel structure. The integrated in-situ chemical clean operation includes chemical rinse (using a solution with an oxidizing agent), contact-type clean, non-contact type clean, and chemical cleaning cycle approaches of oxidizer/dilute hydrofluoric acid. Since visible or non-visible slurry residues, polymer residues, and organic fall-on particles on the surface of the epitaxial channel structure can be effectively removed by using the integrated in-situ chemical clean operation, the yield performance of the FinFET device can be improved.

Referring to FIG. 1A to FIG. 1L, FIG. 1A to FIG. 1L are schematic structure diagrams of intermediate stages showing a method for manufacturing a FinFET device in accordance with some embodiments of the present disclosure. As shown in FIG. 1A, a semiconductor substrate 110 is provided. In some embodiments, the semiconductor substrate 110 may be a semiconductor material and may include structures including a graded layer or a buried oxide, for example. In some embodiments, the semiconductor substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 110. Alternatively, the semiconductor substrate 110 may be an active layer of a semiconductor-on-insulator (SOI) substrate or a multi-layered structure such as a silicon-germanium layer formed on a bulk silicon layer.

Figure 1B:
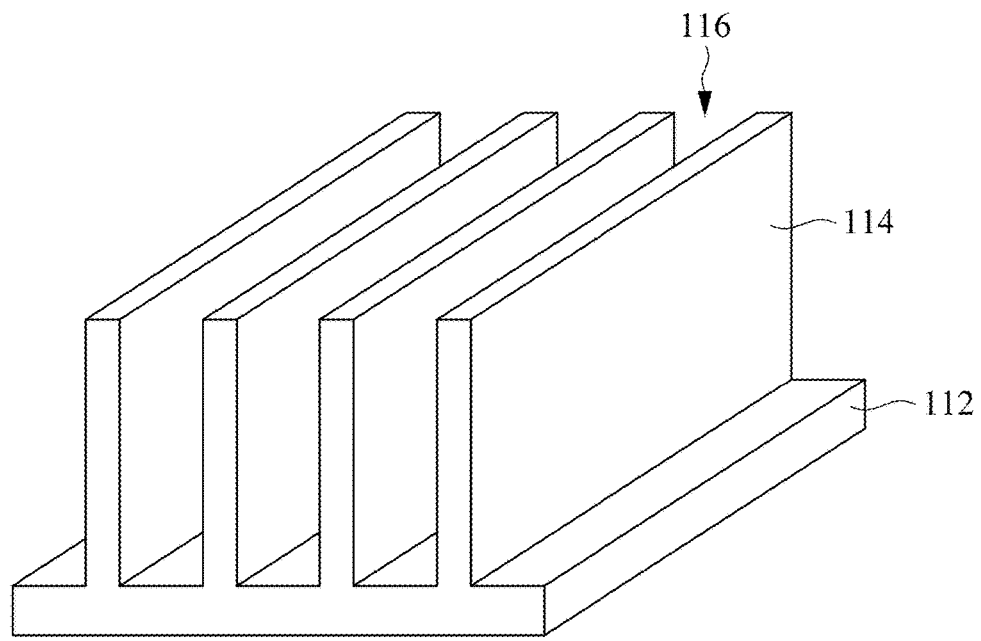

As shown in FIG. 1B, the semiconductor substrate 110 is etched to form fin portions 114(referred to as "fins" hereinafter) located on a bottom portion 112. In some embodiments, the semiconductor substrate 110 is etched to form trenches 116 in the semiconductor substrate 110, thereby forming the fins 114. The etching may be any acceptable etch operation, such as a reactive ion etch (RIE), neutral beam etch (NBE), the like, or a combination thereof. In some embodiments, the etching may be anisotropic.

Figure 1C:
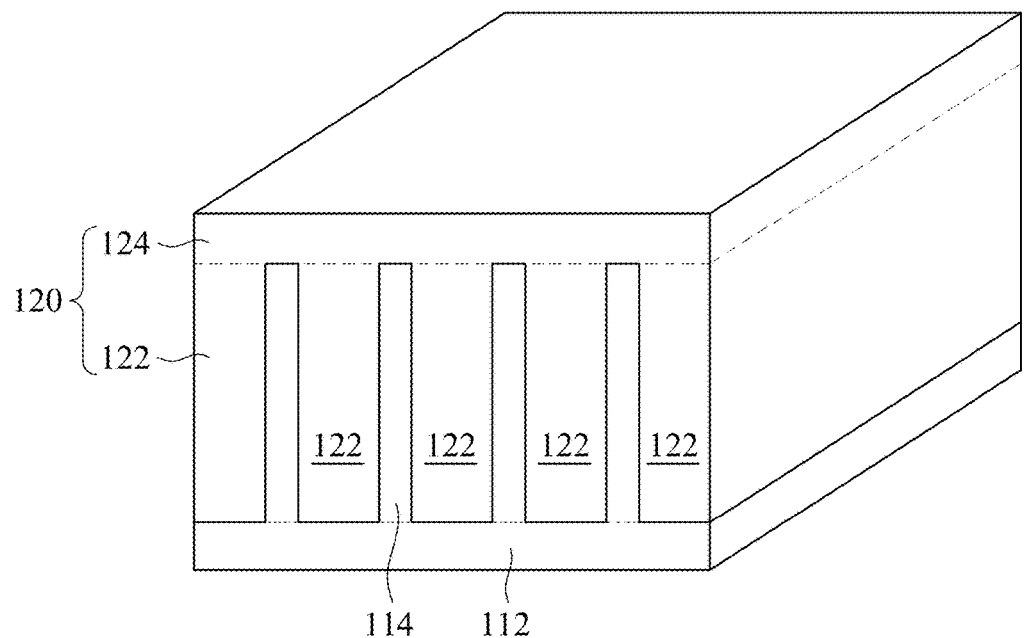

As shown in FIG. 1C, the trenches 116 are filled with an insulation material structure 120. The insulation material structure 120 includes isolation portions 122 and a top portion 124 on the isolation portions 122 and the fins 114. The isolation portions 122 are located between two adjacent fins 114. In some embodiments, the insulation material structure 120 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable operation may be used. For example, the insulation material structure 120 is silicon oxide formed by a FCVD operation.

Figure 1D:
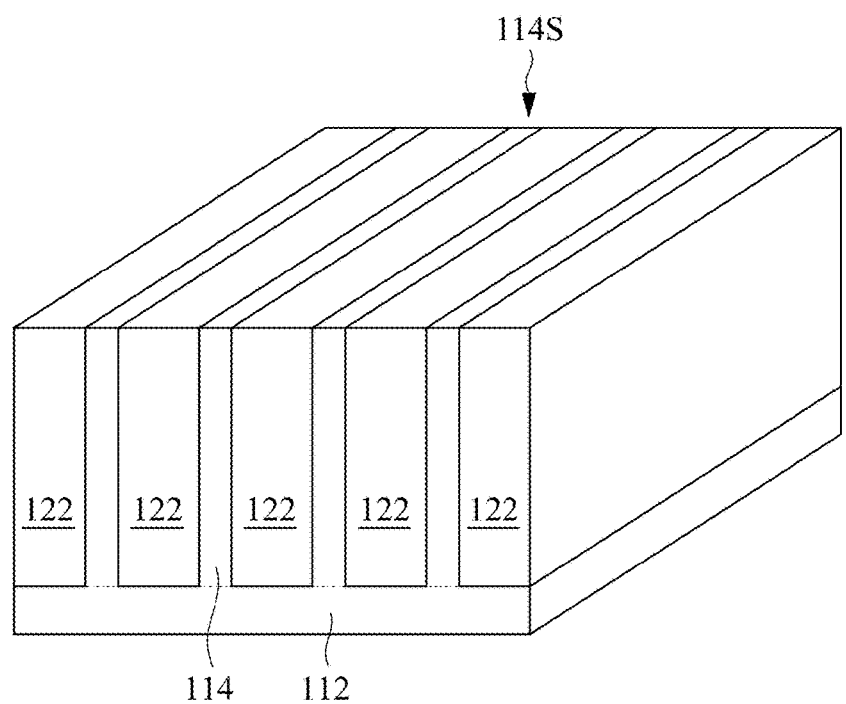

As shown in FIG. 1D, the top portion 124 of the insulation material structure 120 is removed to expose top surfaces 114S of the fins 114. In some embodiments, the top portion 124 of the insulation material structure 120 is removed by using a planarization operation, such as a chemical mechanical polish (CMP), but embodiments of the present disclosure are not limited thereto. After the top portion 124 of the insulation material structure 120 is removed, the isolation portions 122 remain between two adjacent fins 114.

Figure 1E:
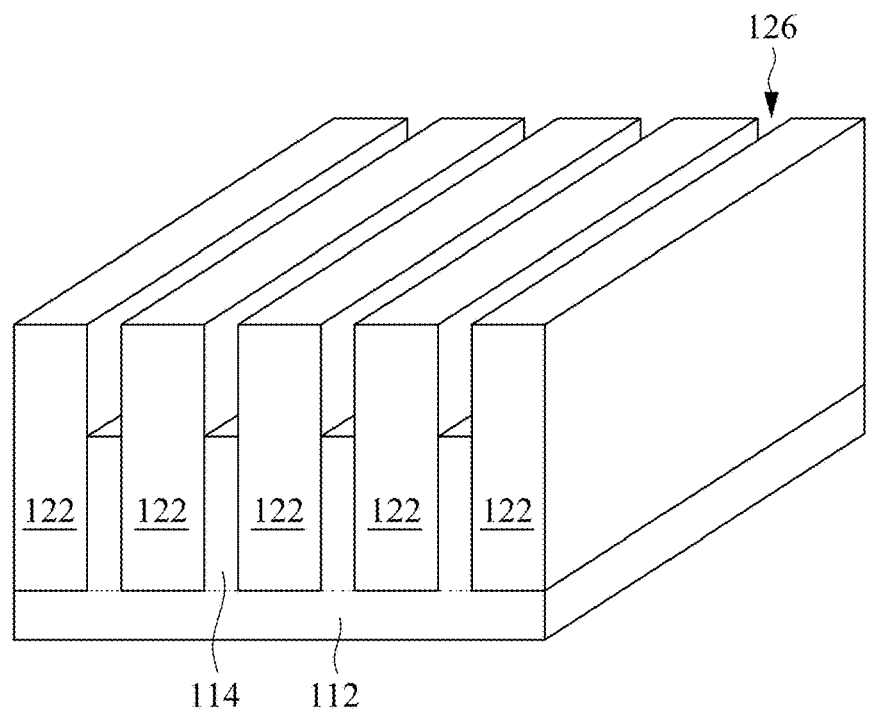

As shown in in FIG. 1E, top portions of the fins 114 are removed to form recesses 126 defined by the isolation portions 122 of the insulation material structure 120. The recesses 126 may be formed by etching using any acceptable etch process, such as a RIE, NBE, tetramethylammonium hydroxide (TMAH), ammonium hydroxide (NH$_4$OH), a wet etchant capable of etching silicon with good etch selectivity between silicon and a material of the isolation portions 124 of the insulation material structure 120, the like, or a combination thereof. The etching may be anisotropic. In other embodiments, the top surfaces of the fins 114 may be etched to have different configurations.

Figure 1F:
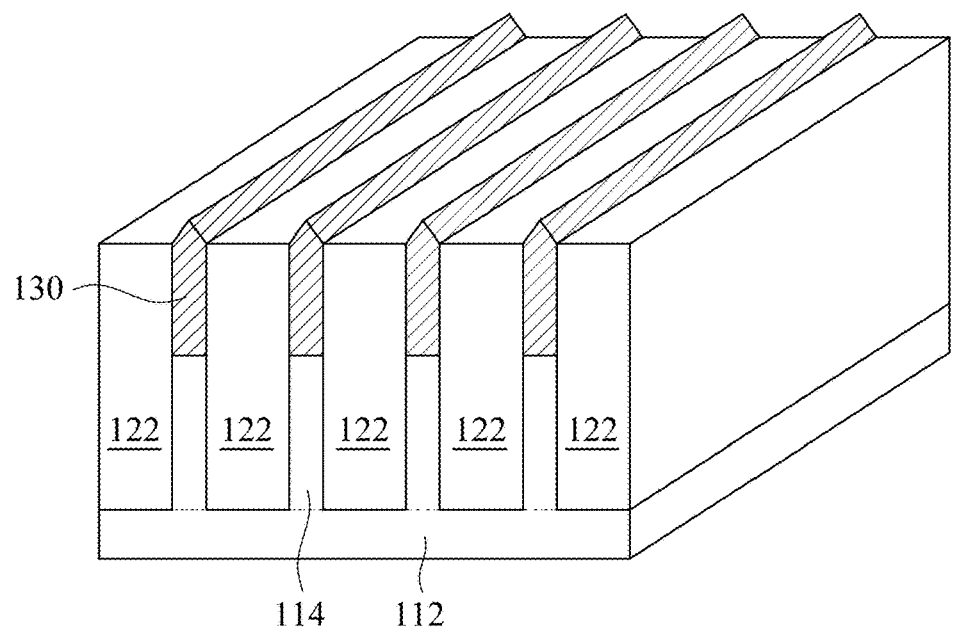

As shown in in FIG. 1F, epitaxial channel structures, such as epitaxial fins 130, are formed in the recesses 126. The epitaxial fins 130 are configured to provide channel regions of field effect transistors. For example, a field effect transistor includes a source region and a drain region separated by a channel region. A gate structure is located between the source regions and the drain region, and configured to control the flow of charge carriers (e.g., holes or electrons) in the channel region. Because the epitaxial fins 130 are used to provide the channel regions, the epitaxial fins 130 may be referred to as epi-channel structures.

In some embodiments, the epitaxial fins 130 are formed by epitaxially growing a material in the recesses 126, such as by metal-organic CVD (MOCVD), molecular beam epitaxy (MBE), liquid phase epitaxy (LPE), vapor phase epitaxy (VPE), selective epitaxial growth (SEG), the like, or a combination thereof. In some embodiments, a material of the epitaxial fins 130 is different from a material of the semiconductor substrate 110. In some embodiments, the epitaxial fins 130 include Si, SiP, SiPC, SiGe, SiGeB, Ge or a III-V compound semiconductor. For example, the available materials for forming III-V compound semiconductor include, but are not limited to, InP, GaAs, AlAs, InAs, InAlAs, InGaAs, InSb, GaSb, InGaSb, and the like. In other embodiments, the epitaxial fins 130 can be other material, such as silicon, silicon carbide, germanium, a II-VI compound semiconductor, or the like.

Figure 1G:
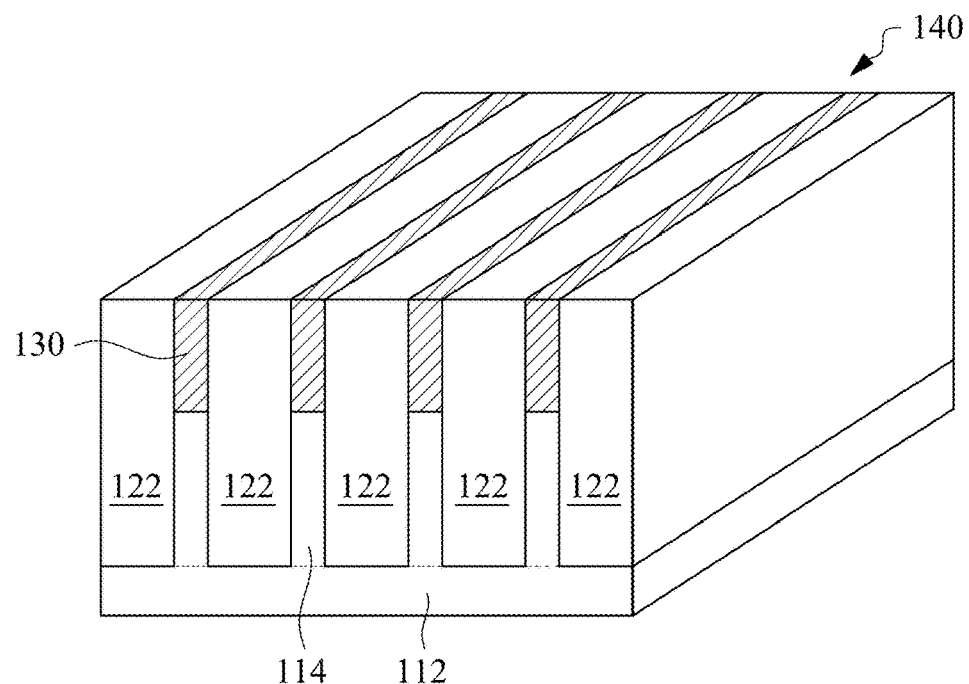

As shown in FIG. 1G, a planarization operation is conducted to polish top of the isolation portions 122 and the epitaxial fins 130 to form a flat surface 140. In some embodiments, the planarization operation is conducted by using chemical mechanical polish (CMP), but embodiments of the present disclosure are not limited thereto. Because the surfaces of the epitaxial fins 130 are hydrophobic, extra wetting agents or surfactants are used in the chemical mechanical polish operation. However, these wetting agents and surfactants are organic compounds induce visible or non-visible polymer residues and organic particles on the surface of the epitaxial fins 130, and severe impact device performance or product yield. Therefore, a method for cleaning the exposed (polished) surfaces of the epitaxial fins 130 is conducted after the planarization operation is conducted.

Figure 1H:
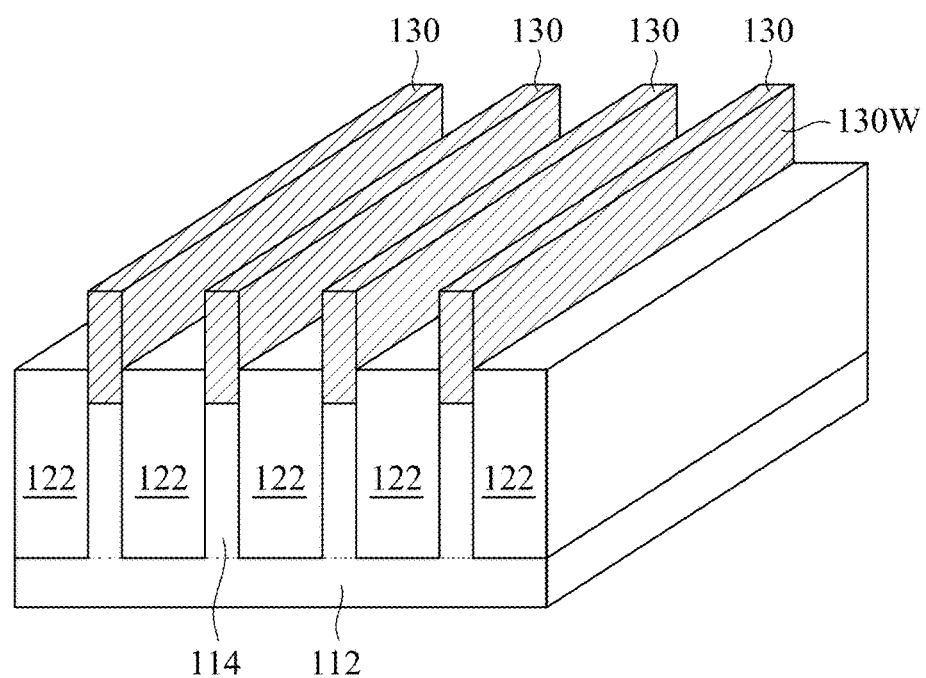

As shown in FIG. 1H, the isolation portions 122 are etched to expose top portions of the epitaxial fins 130 after the exposed surfaces of the epitaxial fins 130 are cleaned. In some embodiments, sidewalls 130W of the fin epitaxial fins 130 are exposed after etching the isolation portions 122. In some embodiments, the etching may be any acceptable etch operation, such as a reactive ion etch (RIE), neutral beam etch (NBE), the like, or a combination thereof.

Figure 1I:
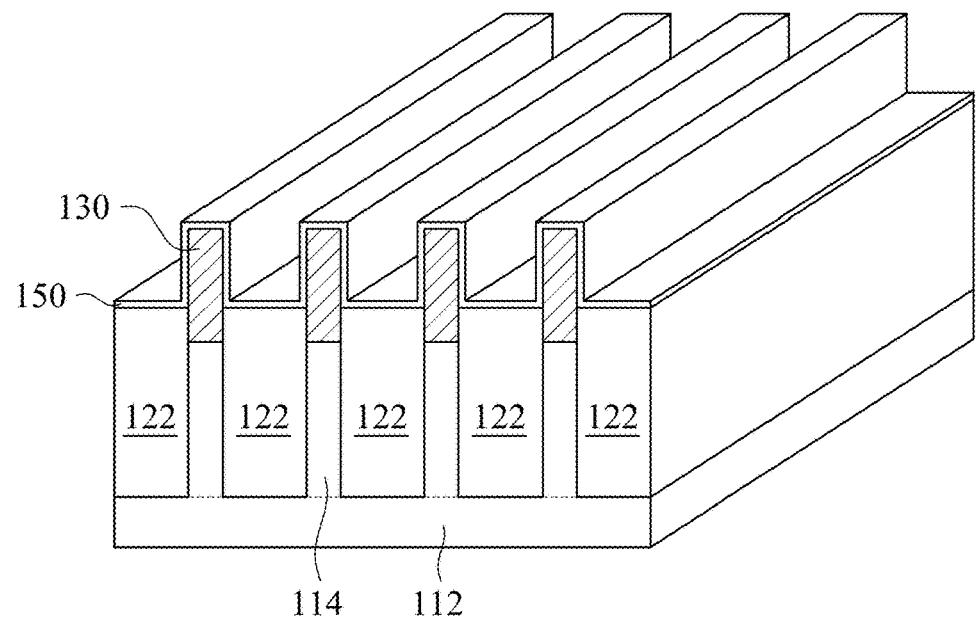

As shown in FIG. 1I, a gate dielectric layer 150 is blanketly formed on the isolation portions 122 and the epitaxial fins 130. In some embodiments, the gate dielectric layer 150 is a high-k dielectric layer. For example, the gate dielectric layer 150 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material. In some embodiments, the gate dielectric layer 150 can be formed by using a operation such as chemical vapor deposition (CVD), plasma enhanced chemical vapor deposition (PECVD), or low pressure chemical vapor deposition (LPCVD).

Figure 1J:
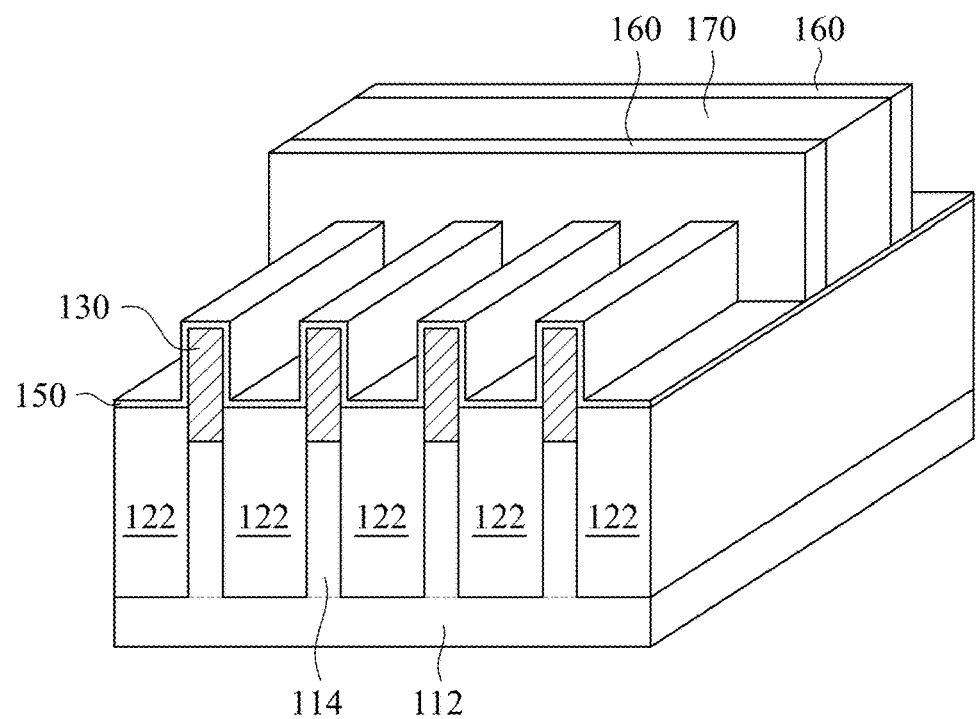

As shown in FIG. 1J, spacers 160 and gate electrode 170 are formed on the gate dielectric layer 150. In some embodiments, the spacers 160 are formed from a dielectric material, such as silicon nitride, silicon carbide, silicon oxynitride, other suitable materials, and/or combinations, but embodiments of the present disclosure are not limited thereto. The spacers 160 may be formed by methods utilized to form such a layer, such as chemical vapor deposition (CVD), plasma enhanced CVD, sputter, and other methods known in the art.

In some embodiments, the gate electrode layer 170 may be formed from a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc. The gate electrode layer 170 may be deposited by chemical vapor deposition (CVD), sputter deposition, or other techniques known and used in the art for depositing conductive materials.

Figure 1K:
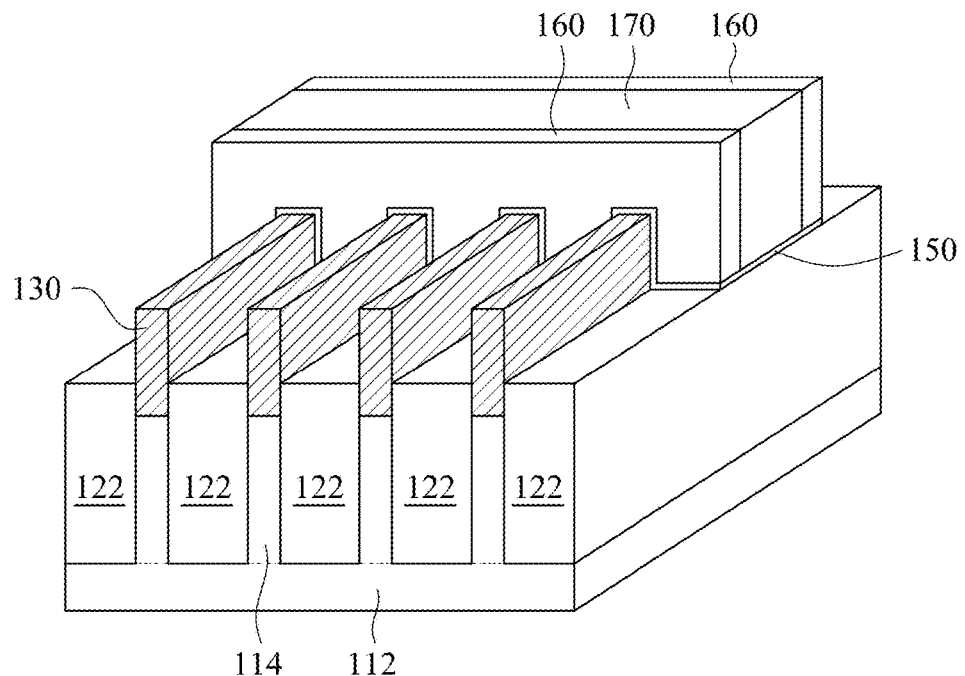

As shown in FIG. 1K, portions of the gate dielectric layer 150 are removed to expose the epitaxial fins 130. In some embodiments, a portion of the gate dielectric layer 150 covered by the spacers 160 and the gate electrode 170 remains, and the other portions of the gate dielectric layer 150 not covered by the spacers 160 and the gate electrode 170 are etched to expose underlying epitaxial fins 130.

Figure 1L:
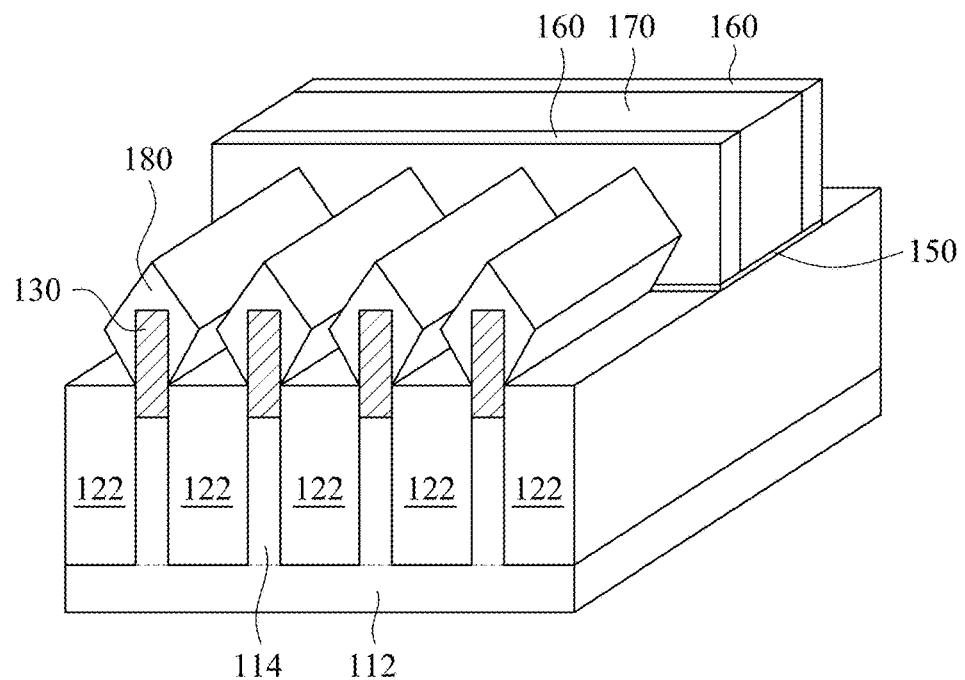

As shown in FIG. 1L, sources/drains 180 are formed on the exposed epitaxial fins 130 and cover the epitaxial fins 130. In some embodiments, the sources/drains 180 are formed from silicon germanium and epitaxially grown from a surface of the fins 114, but embodiments of the present disclosure are not limited thereto. In some embodiments, a doping operation may be conducted on the sources/drains 180 to dope the sources/drains 180 with an n-type or p-type dopant.

Figure 2A:
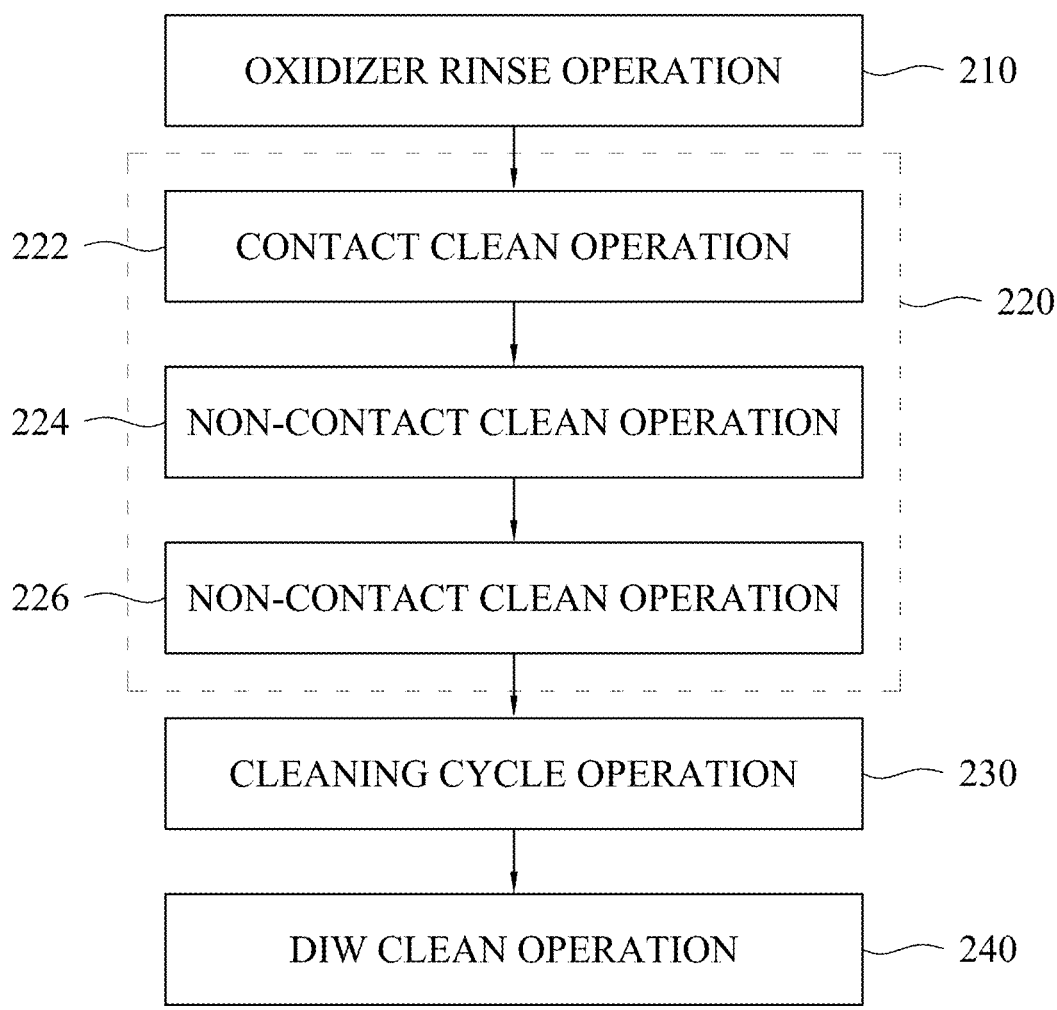
FIG. 2A is a flow chart showing a method for cleaning a wafer having polished epitaxial channel structures as shown in FIG. 1G.
Figure 2B:
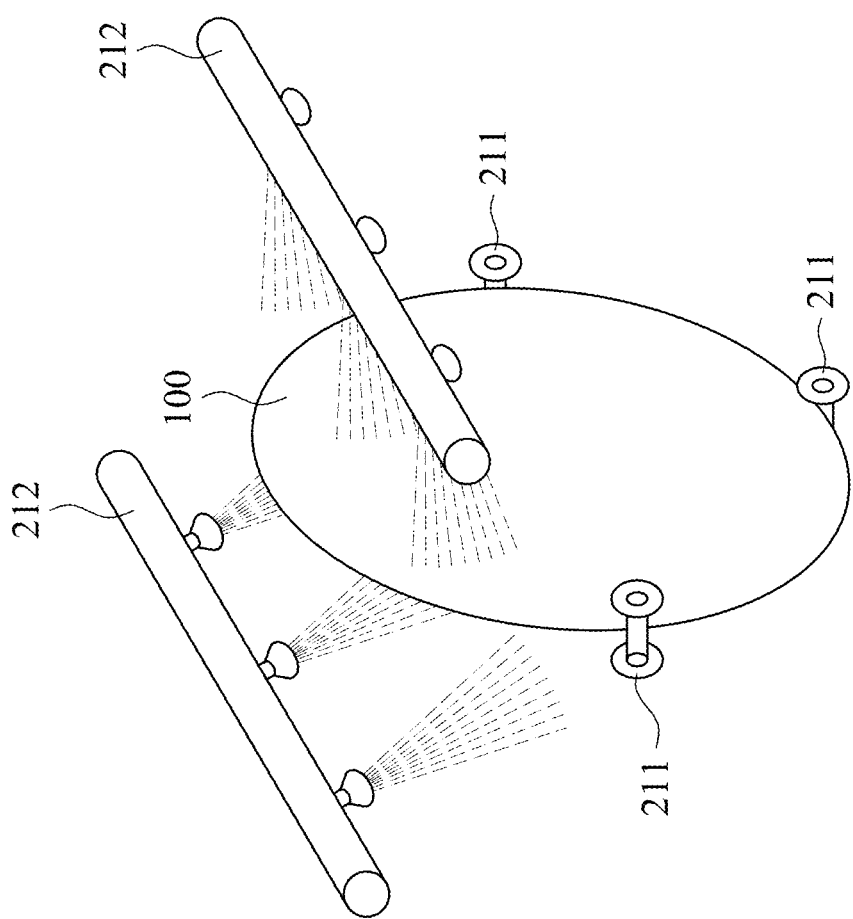
FIG. 2B is a schematic diagram showing a rinse cleaning device in accordance with some embodiments of the present disclosure.

Referring to FIG. 2A, FIG. 2A is a flow chart showing a method 200 for cleaning a wafer having polished epitaxial channel structures as shown in FIG. 1G. The method 200 includes plural operations conducted on the wafer to clean the exposed surfaces of the epitaxial channel structures. In the method 200, at first, an oxidizer rinse operation 210 is conducted to clean the wafer. In some embodiments, as shown in FIG. 2B, a rinse cleaning device used in the oxidizer rinse operation 210 includes rollers 211 and spray bars 212 to clean a wafer 100 having polished epitaxial channel structures. The wafer 100 is placed on the rollers 2 to enable the wafer 100 to be rotated. When the oxidizer rinse operation 210 is conducted, the spray bars 212 provide a solution with an oxidizing agent onto the wafer 100, thereby cleaning the exposed surfaces of the polished epitaxial channel structures of the wafer 100.

In some embodiments, the solution with an oxidizing agent is used to decrease the interface adhesion between the residues/particles and the exposed surfaces of the epitaxial channel structures. A cleaning chemical of the oxidizing agent include ozone and de-ionized water ($DIO_3$), hydrogen peroxide($H_2O_2$), a solution of ammonium persulfate (($NH_4$)$_2S_2O_8$), sodium hypochlorite(NaClO), sulfuric peroxide mixture (SPM), a solution of $NH_3/H_2O_2/H_2O$ (SC1), a solution of $HCl/H_2O_2/H_2O$ (SC2) or a combination thereof. In some embodiments, a concentration of the ozone in $DIO_3$ is in a range substantially from 1 ppm to 10 ppm, a concentration of the hydrogen peroxide is in a range substantially from 0.1 weight % to 10 weight %, a concentration of ammonium persulfate is in a range substantially from 0.1 weight % to 44 weight %, and a concentration of the sodium hypochlorite is in a range substantially from 0.1 weight % to 16 weight %.

Then, operation 220 is conducted on the wafer 100. The operation 220 includes at least one contact or non-contact-type cleaning operation. The operation 220 includes at least one clean operation which is a contact-type cleaning operation or non-contact-type cleaning operation. In some embodiments, the operation 220 includes one contact-type cleaning operation and two non-contact-type cleaning operations. At the operation 220, the contact-type cleaning operation 222 is conducted at first, and then the two non-contact-type cleaning operations 224 and 226 are conducted sequentially. However, embodiments of the present disclosure are not limited thereto. In some embodiments, the non-contact-type cleaning operations are conducted at first, and then the contact-type cleaning operation is conducted. In some embodiments, the operation 220 includes three contact-type cleaning operations. In some embodiments, the operation 220 includes two contact-type cleaning operations and one non-contact-type cleaning operation. In some embodiments, the operation 220 includes three non-contact-type cleaning operations.

Figure 2C:
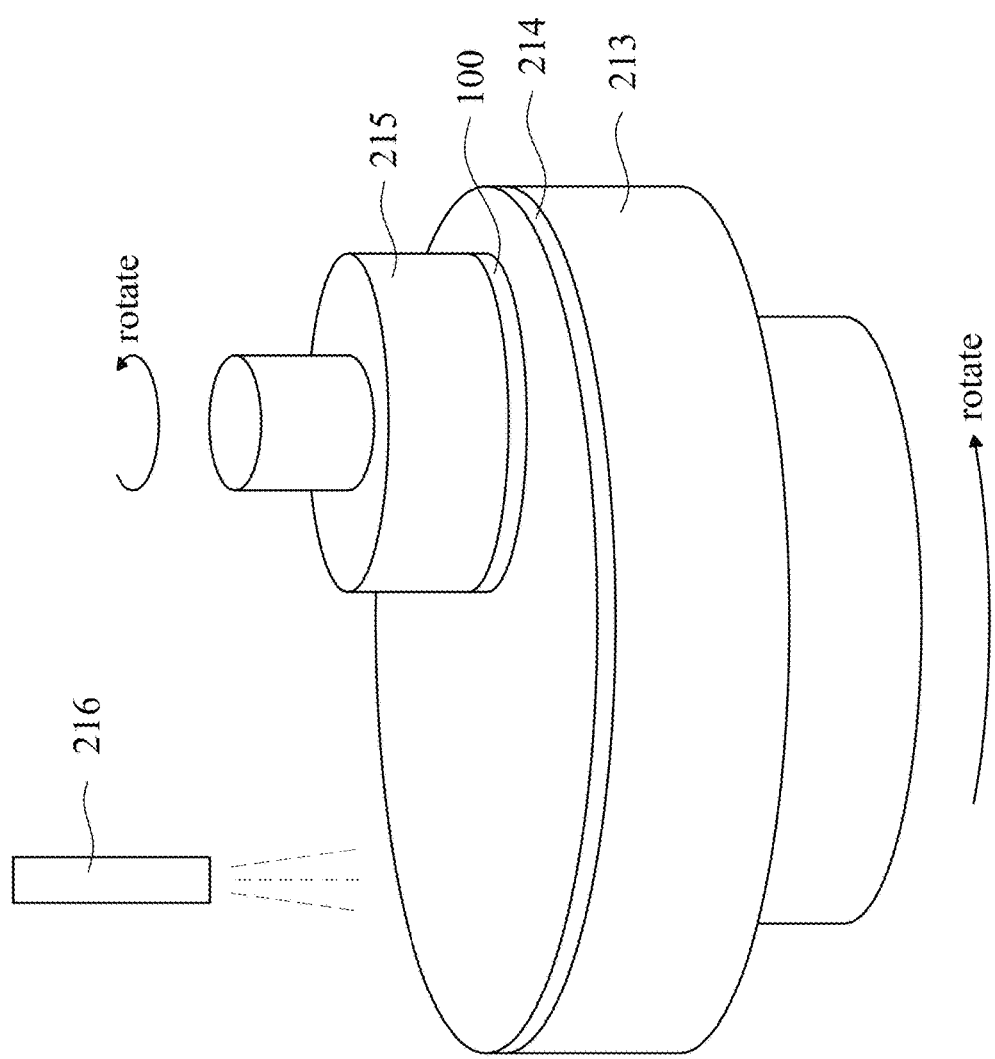
FIG. 2C is a schematic diagram showing a contact-type cleaning device used in the contact-type cleaning operation in accordance with some embodiments of the present disclosure.

Referring to FIG. 2C, FIG. 2C is a schematic diagram showing a contact-type cleaning device used in the contact-type cleaning operation in accordance with some embodiments of the present disclosure. In this case, a soft pad cleaner is used in the contact-type cleaning operation of the operation 220. However, embodiments of the present disclosure are not limited thereto. In some embodiments, other clean device, such as a pencil cleaner (such as a pencil type brush) or a roller cleaner (such as a roller type brush) can be used in the operation 220.

As shown in FIG. 2C, the contact-type cleaning device includes a supporter 213, a soft pad 214, a carrier 215 and a nozzle 216. The supporter 213 is used to support the soft pad 214, the carrier 215 is used to carry the wafer 100, and the nozzle 216 is used to provide a cleaning chemical onto the soft pad 214. When the contact-type cleaning device cleans the wafer 100, the supporter 213 is rotated to enable the soft pad 214 disposed on the supporter 213 to rotate, and the nozzle 216 provides the cleaning chemical onto the soft pad 214. Therefore, the wafer 100 can be cleaned by the cleaning chemical. In some embodiments, the carrier 215 can be rotated to rotate the semiconductor device 100 carried by the carrier 215. In some embodiments, the soft pad 214 is similar to a soft pad used in the chemical mechanical polish (CMP), but embodiments of the present disclosure are not limited thereto.

Figure 2D:
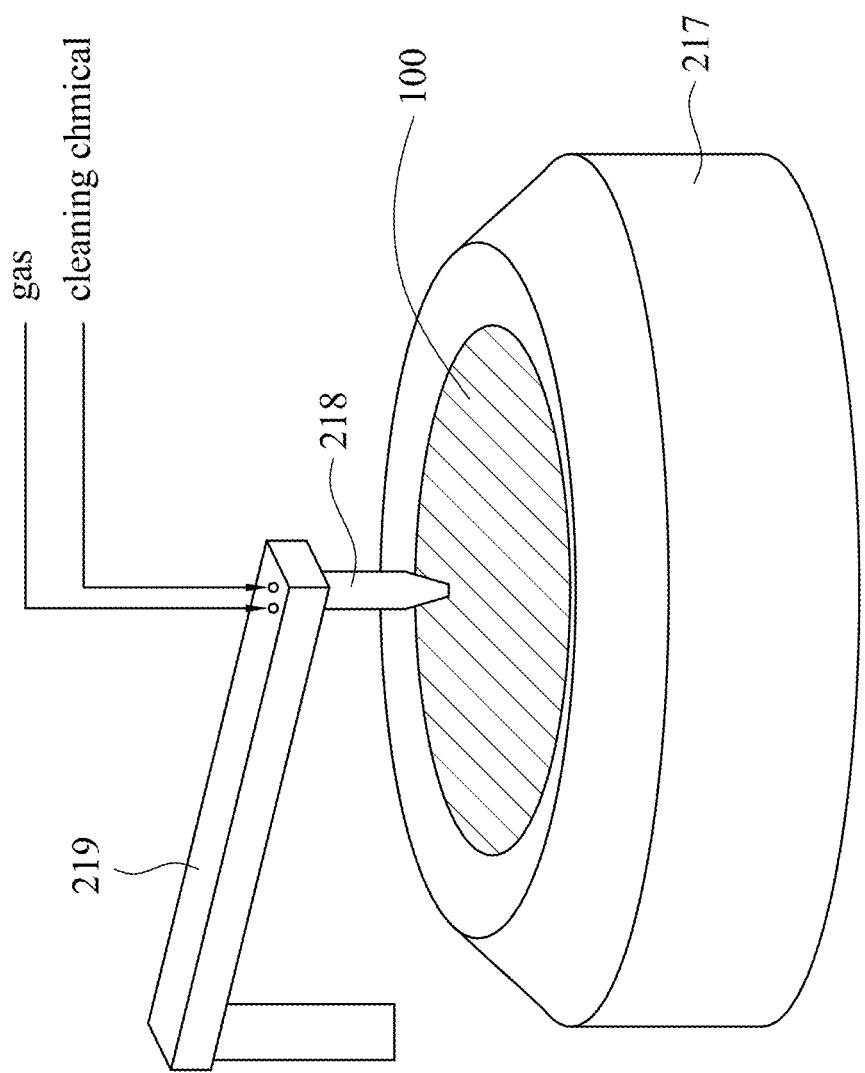
FIG. 2D is a schematic diagram showing a non-contact-type cleaning device used in a non-contact-type cleaning operation in accordance with some embodiments of the present disclosure.

Referring to FIG. 2D, FIG. 2D is a schematic diagram showing a non-contact-type cleaning device used in the non-contact-type cleaning operation of the operation 220 in accordance with the present disclosure. In this case, the non-contact-type cleaning device is a jet-spray cleaner. However, embodiments of the present disclosure are not limited thereto. In some embodiments, other clean device, such as an ultrasonic (20~400 kHz) cleaner or a megasonic (0.4~5 MHz) cleaner can be used in the operation 220.

As shown in FIG. 2D, the non-contact-type cleaning device includes a chamber 217, a jet nozzle 218 and a slurry delivery arm 219. The chamber 217 is used to receive the wafer 100. The jet nozzle 218 is disposed on the slurry delivery arm 219 to provide a cleaning chemical onto the wafer 100. In some embodiments, gas (such as Ar) and the cleaning chemical are provided to the jet nozzle 218, thereby enabling the jet nozzle 218 to provide the cleaning chemical with a flow rate in a range substantially from 300 cc/min to 1000 cc/min, but embodiments of the present disclosure are not limited thereto. In some embodiments, the wafer 100 is rotated in the chamber 217, but embodiments of the present disclosure are not limited thereto.

In some embodiments, the contact-type cleaning operation and the non-contact-type cleaning operation uses cleaning chemical including de-ionized water (DIW), ammonium hydroxide ($NH_4OH$), ozone and de-ionized water ($DIO_3$), hydrogen peroxide($H_2O_2$), a solution of ammonium persulfate (($NH_4)_2S_2O_8$), sodium hypochlorite(NaClO), sulfuric peroxide mixture (SPM), a solution of $NH_3/H_2O_2/H_2O$ (SC1), a solution of $HCl/H_2O_2/H_2O$ (SC2), diluted hydrofluoric acid (hydrogen fluoride), diluted hydrochloric acid (HCl), Anionic Surfactant, Cationic surfactant, Non-ionic Surfactant, Zwitterionic Surfactants or a combination thereof. Further, in some embodiments, a concentration of the ozone in $DIO_3$ is in a range substantially from 1 ppm to 10 ppm. In some embodiments, a concentration of the hydrogen peroxide is in a range substantially from 0.1 weight % to 10 weight %. In some embodiments, a concentration of the ammonium hydroxide is in a range substantially from 0.01 weight % to 2 weight %. In some embodiments, a concentration of ammonium persulfate is in a range substantially from 0.1 weight % to 44 weight %. In some embodiments, a concentration of the sodium hypochlorite is in a range substantially from 0.1 weight % to 16 weight %. In some embodiments, a concentration of the hydrogen fluoride is in a range substantially from 0.01 weight % to 2 weight %. In some embodiments, a concentration of the hydrochloric acid is in a range substantially from 0.01 weight % to 2 weight %.

Figure 2E:
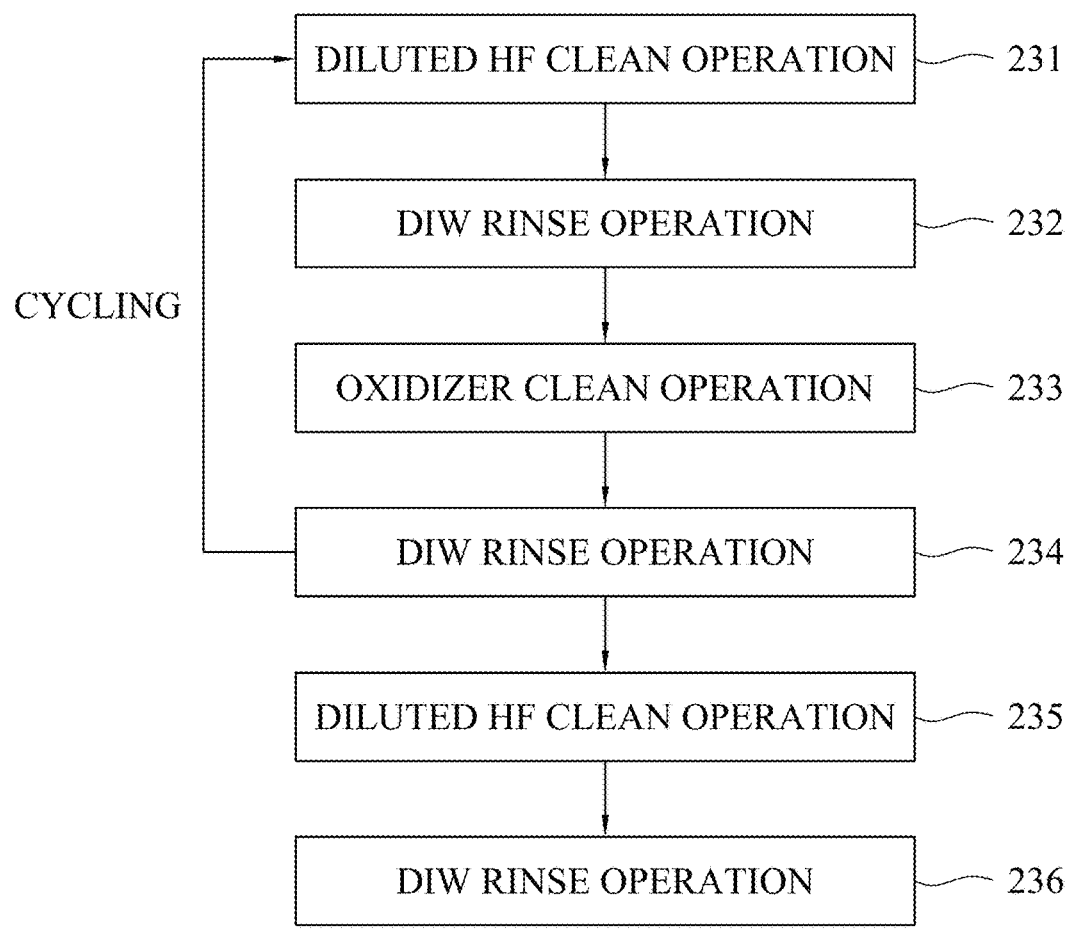
FIG. 2E is a flow chart showing a cleaning cycle operation in accordance with some embodiments of the present disclosure.

Returning to FIG. 2A, after the operation 220, a cleaning cycle operation 230 is conducted on the wafer 100. Referring to FIG. 2E, FIG. 2E is a flow chart showing the cleaning cycle operation 230 in accordance with some embodiments of the present disclosure. In the cleaning cycle operation 230, at first, a diluted hydrofluoric acid clean operation 231 is conducted on the wafer 100. In some embodiments, a concentration of the diluted hydrofluoric acid is in a range substantially from 0.1 weight % to 2 weight %. Then, de-ionized water (DIW) rinse operation 232 is conducted on the wafer 100. Thereafter, an oxidizer clean operation 233 is conducted on the wafer 100. In some embodiments, the oxidizer clean operation 233 is similar to the oxidizer rinse operation 210 as shown in FIG. 2B, but embodiments of the present disclosure are not limited thereto. Then, another de-ionized water (DIW) rinse operation 234 is conducted on the wafer 100. In some embodiments, the de-ionized water (DIW) rinse operation 234 is similar to the de-ionized water (DIW) rinse operation 232, but embodiments of the present disclosure are not limited thereto. For example, in some embodiments, the de-ionized water (DIW) rinse operation 234 is different from the de-ionized water (DIW) rinse operation 232.

Thereafter, the operations 231-234 may be repeated to clean the wafer 100. Cycling times of the operations 232-238 may be determined by user's demands for better cleaning performance. After the de-ionized water (DIW) rinse operation 234, another diluted hydrofluoric acid clean operation 235 is conducted on the wafer 100. In some embodiments, the diluted hydrofluoric acid clean operation 235 is similar to the diluted hydrofluoric acid clean operation 231, but embodiments of the present disclosure are not limited thereto. For example, in some embodiments, the diluted hydrofluoric acid clean operation 235 is different from the diluted hydrofluoric acid clean operation 231. Then, another de-ionized water (DIW) rinse operation 236 is conducted on the wafer 100. In some embodiments, the de-ionized water (DIW) rinse operation 236 is similar to the de-ionized water (DIW) rinse operation 232, but embodiments of the present disclosure are not limited thereto. For example, in some embodiments, the de-ionized water (DIW) rinse operation 236 is different from the de-ionized water (DIW) rinse operation 232. In some embodiments, the de-ionized water (DIW) rinse operations 232, 234 and 236 may be omitted.

After cleaning the wafer 100, a dry operation is conducted to dry the wafer 100. In some embodiments, the dry operation may be spin rinse dry, or isopropyl alcohol (IPA) vapor dry. For example, when the IPA vapor dry is conducted, the wafer 100 is placed into a sealed vessel, and then IPA vapor is directed to the wafer 100 to remove water from the wafer 100.

In the above embodiments, the cleaning cycle operation 230 begins at the diluted hydrofluoric acid clean operation 231 and ends at the diluted hydrofluoric acid clean operation 235 (when the de-ionized water (DIW) rinse operation 236 is omitted). However, in some embodiments, the diluted hydrofluoric acid clean operation 235 and the de-ionized water (DIW) rinse operations 236 are omitted, and the cleaning cycle operation 230 ends at the oxidizer clean operation 233 (when the de-ionized water (DIW) rinse operations 234 is omitted.

Figure 2F:
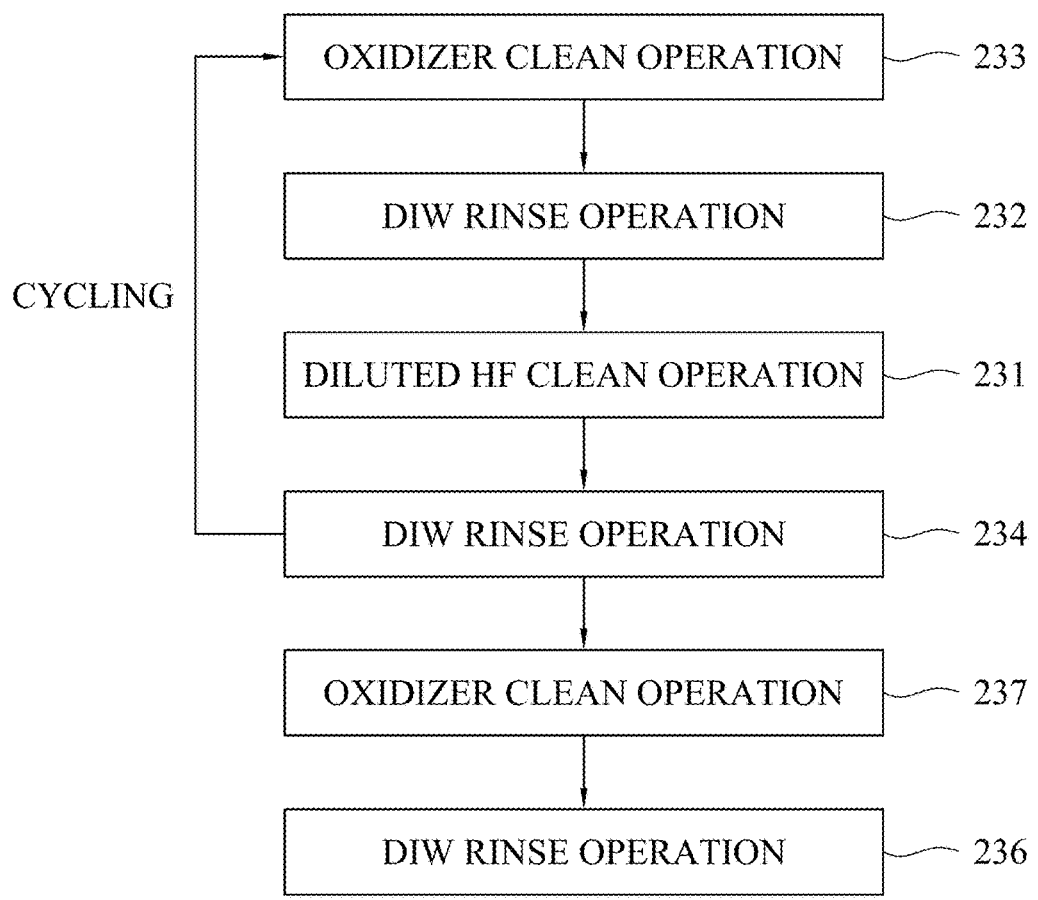
FIG. 2F is a flow chart showing a cleaning cycle operation in accordance with some embodiments of the present disclosure.

Further, in some embodiments, the cleaning cycle operation 230 begins at the oxidizer clean operation 233, as shown in FIG. 2F. In some embodiments, the cleaning cycle operation 230 begins at the oxidizer clean operation 233 and ends at an oxidizer clean operation 237 (when the de-ionized water (DIW) rinse operation 236 is omitted), in which, the oxidizer clean operation 237 is similar to the oxidizer clean operation 233, but embodiments of the present disclosure are not limited thereto. In some embodiments, the oxidizer clean operation 237 and the de-ionized water (DIW) rinse operations 236 are omitted, and the cleaning cycle operation 230 ends at the diluted hydrofluoric acid clean operation 231 (when the de-ionized water (DIW) rinse operations 234 is omitted).

Figure 2G:
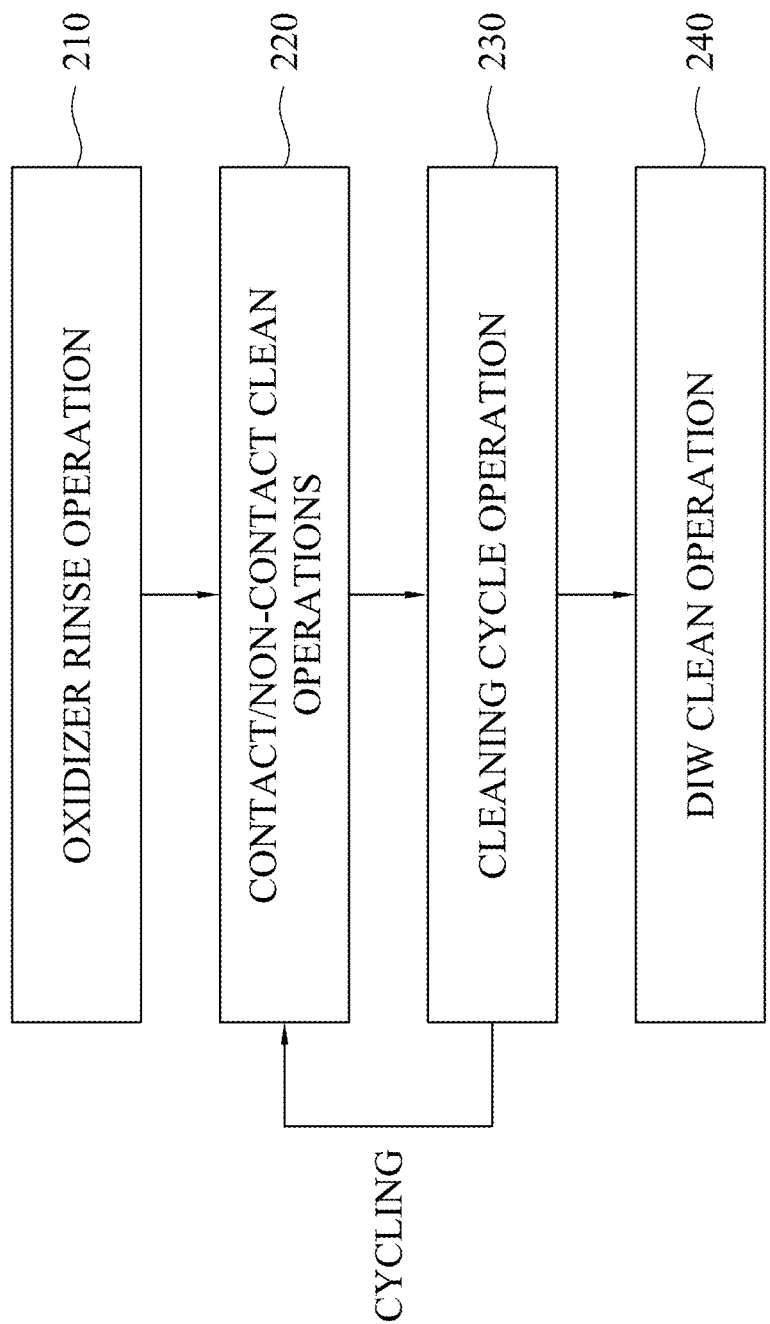
FIG. 2G is a flow chart showing a method for cleaning epitaxial channel structures in accordance with some embodiments of the present disclosure.
Figure 2H:
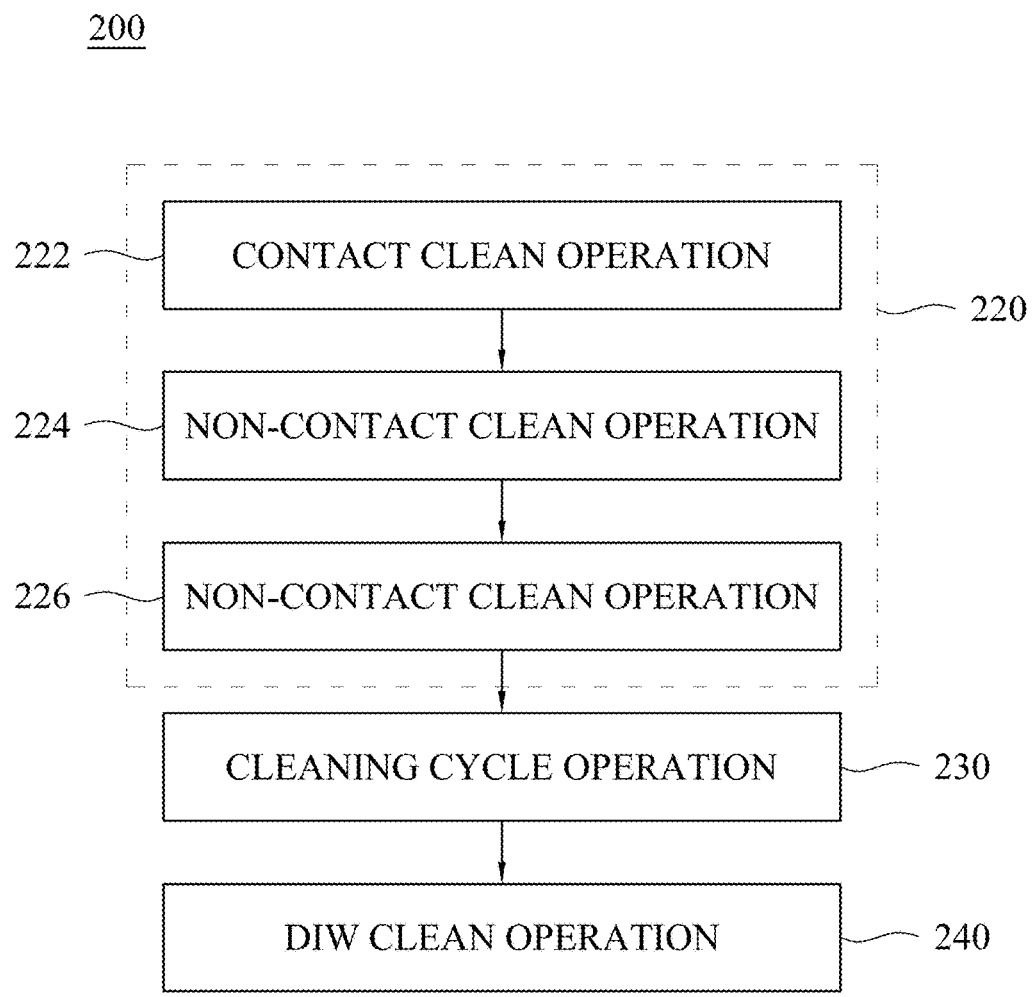
FIG. 2H is a flow chart showing a method for cleaning epitaxial channel structures in accordance with some embodiments of the present disclosure.
Figure 2I:
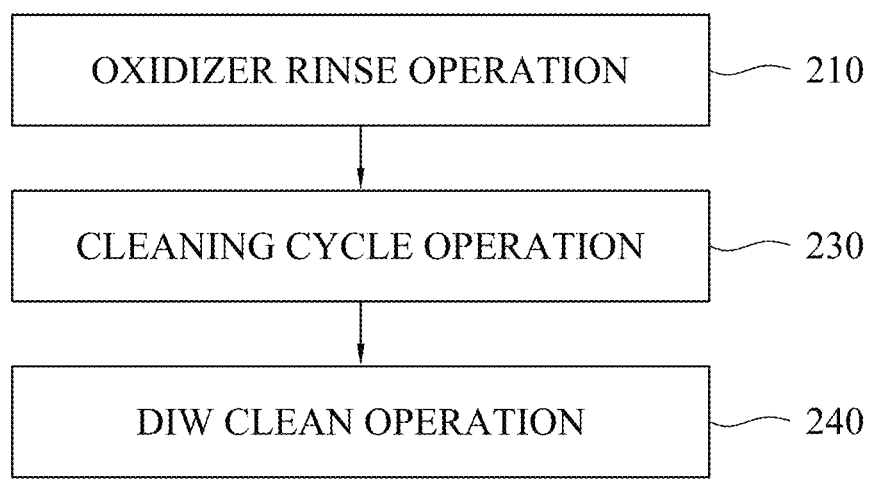
FIG. 2I is a flow chart showing a method for cleaning epitaxial channel structures in accordance with some embodiments of the present disclosure.
Figure 2J:
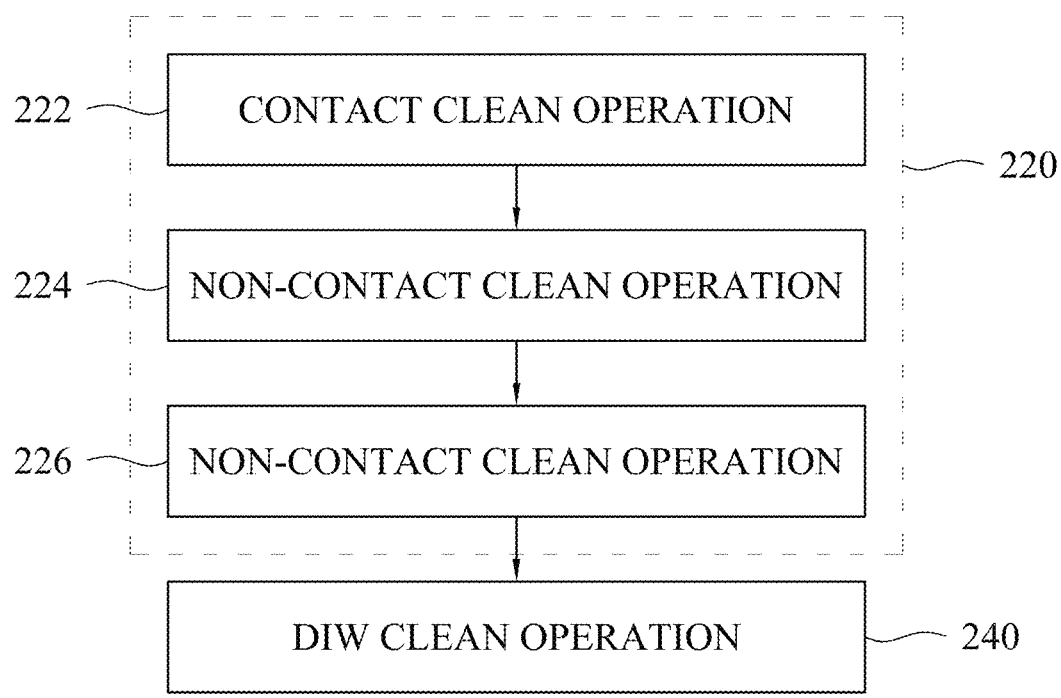
FIG. 2J is a flow chart showing a method for cleaning epitaxial channel structures in accordance with some embodiments of the present disclosure.

In some embodiments, operation 220 and operation 230 are repeated for better clean performance, as shown in FIG. 2G. Cycling times of the operations 220-230 may be determined by user's demands. In some embodiments, one or more operations in the method 200 for cleaning the exposed surfaces of the epitaxial channel structures can be omitted in accordance with user's demands. For example, oxidizer rinse operation 210 can be omitted, as shown in FIG. 2H. For another example, the operation 220 (including contact/non-contact-type cleaning operations) can be omitted, as shown in FIG. 2I. For still another example, oxidizer rinse operation 210 and the cleaning cycle operation 230 are omitted, as shown in FIG. 2J. For still another example, the cycling times of operations 220-230 can be decreased. For still another example, the cycling times of the operations 232-238 of the cleaning cycle operation 230 can be decreased.

Figure 2K:
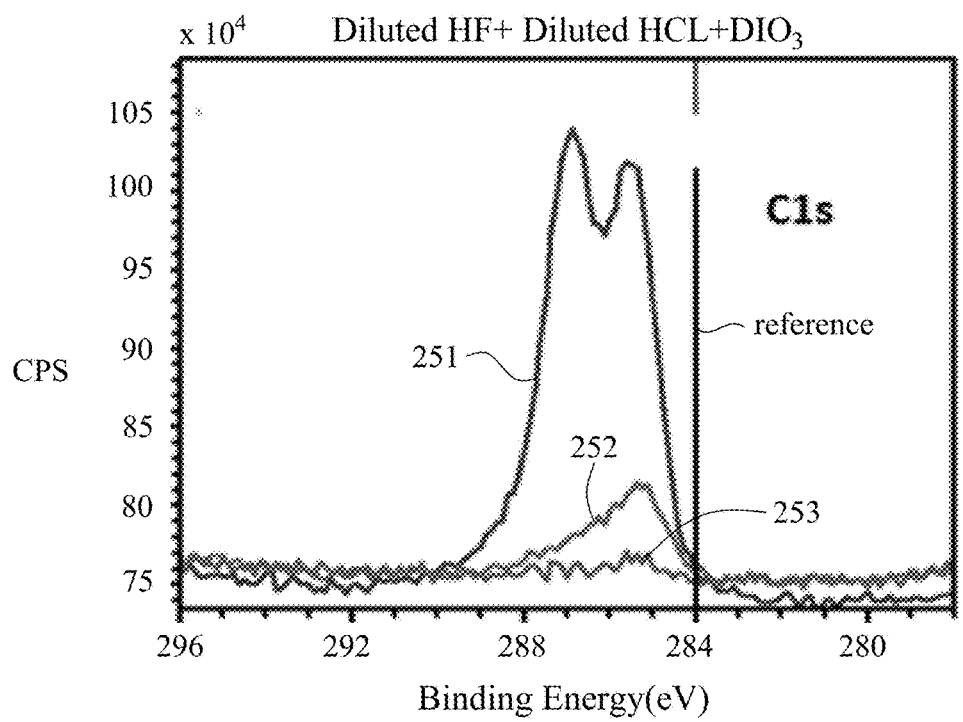
FIG. 2K shows x-ray photoelectron spectroscopy (XPS) measurements of organic residues on a wafer in accordance with a first example.

Hereinafter, two examples are presented to show that the method 200 is capable of removing a significant amount of organic residues and small particles on the wafer 100. Referring to FIG. 2K, FIG. 2K shows x-ray photoelectron spectroscopy (XPS) measurements of organic residues on the wafer 100 in accordance with a first example. A curve 251 represents the amount of organic residues on the wafer 100 after the epitaxial fins 130 are epitaxially grown on the fins 114, a curve 252 represents the amount of organic residues on the wafer 100 after a CMP is performed on the epitaxial fins 130, and a curve 253 represents the amount of organic residues on the wafer 100 after the method 200 is performed on the wafer 100 after the CMP is performed, in which chemicals used in the method 200 of the first example include the diluted hydrofluoric acid, the diluted hydrochloric acid and the de-ionized water. As shown in FIG. 2K, when the method 200 reduces a significant amount of organic residues.

Figure 2L:
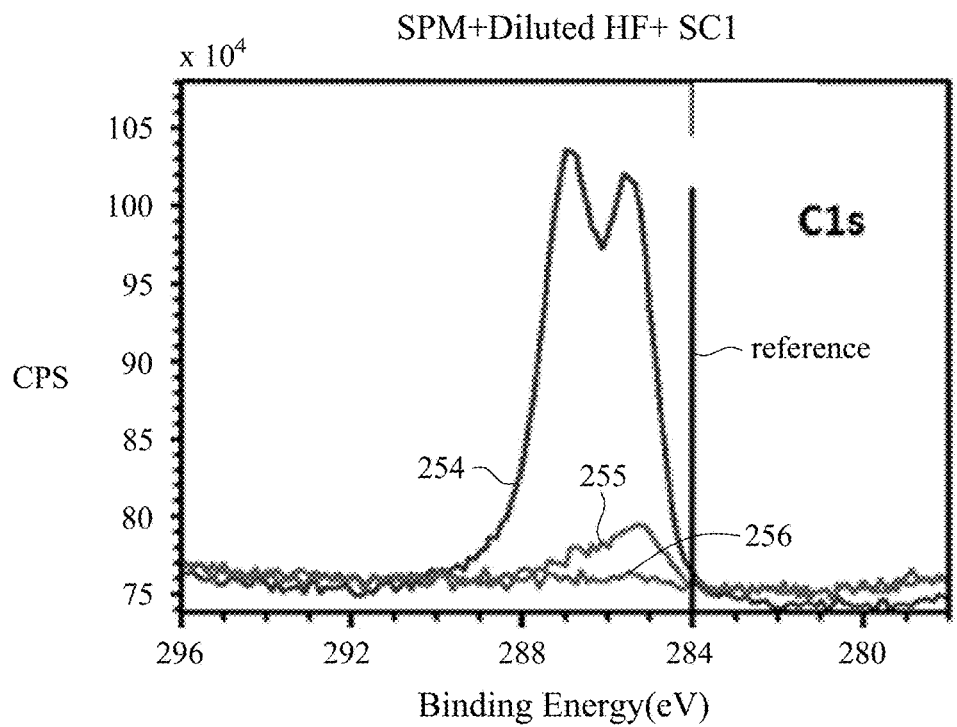
FIG. 2L shows x-ray photoelectron spectroscopy (XPS) measurements of organic residues on a wafer in accordance with a second example.

Referring to FIG. 2L, FIG. 2L shows x-ray photoelectron spectroscopy (XPS) measurements of organic residues on the wafer 100 in accordance with a second example. A curve 254 represents the amount of organic residues on the wafer 100 after the epitaxial fins 130 are epitaxially grown on the fins 114, a curve 255 represents the amount of organic residues on the wafer 100 after a CMP is performed on the epitaxial fins 130, and a curve 256 represents the amount of organic residues on the wafer 100 after the method 200 is performed on the wafer 100 after the CMP is performed, in which chemicals used in the method 200 of the second example include the SPM, the diluted hydrofluoric acid, and the SC1. As shown in FIG. 2L, the method 200 reduces a significant amount of organic residues.

Further, small size particles on the wafer 100 can be significantly decreased by 50% to 55% when the wafer 100 is cleaned by using the method 200. In this case, the operations 231-234 of the cleaning cycle operation 230 are repeated two times.

Figure 3:
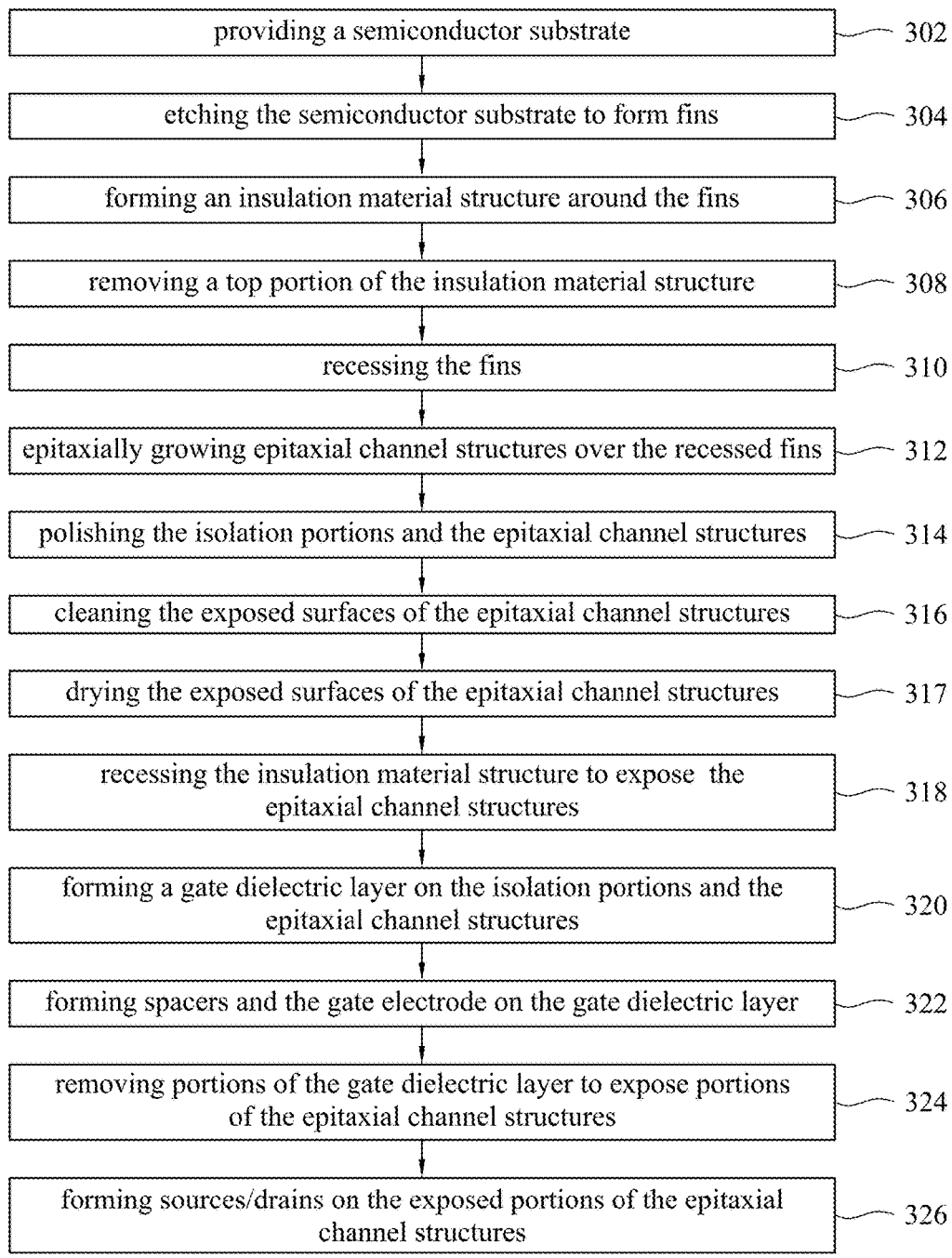
FIG. 3 is a flow chart showing a method for manufacturing a semiconductor device in accordance with some embodiments of the present disclosure.

Referring to FIG. 3, FIG. 3 is a flow chart showing a method 300 for manufacturing a FinFET device in accordance with some embodiments of the present disclosure. The method 300 begins at operation 302. At operation 302, the semiconductor substrate 110 is provided, as shown in FIG. 1A. Then, at operation 304, the semiconductor substrate 110 is etched to form the fins 114, as shown in FIG. 1B. Thereafter, at operation 306, the insulation material structure 120 is formed around the fins 114, as shown in FIG. 1C. Then, at operation 308, the top portion 124 of the insulation material structure 120 is removed to expose top surfaces 114S of the fins 114, as shown in FIG. 1D. Thereafter, at operation 310, the fins 114 are recessed, as shown in FIG. 1E. Then, at operation 312, the epitaxial fins 130 are epitaxially grown over the recessed fins 114, as shown in FIG. 1F. Thereafter, at operation 314, the planarization operation is conducted to polish the top of the isolation portions 122 and the epitaxial fins 130 to form the flat surface 140, as shown in FIG. 1G. Then, at operation 316, the exposed surfaces of the epitaxial fins 130 are cleaned by using the clean method 200. In some embodiments, the dry operation is conducted to dry the exposed surfaces of the epitaxial fins 130.

After the exposed surfaces of the epitaxial fins 130 are dried, at operation 318, the isolation portions 122 of the insulation material structure 120 are recessed such that the epitaxial fins 130 protrude from the recessed insulation structure, as shown in FIG. 1H. Then, at operation 320, the gate dielectric layer 150 is blanketly formed on the isolation portions 122 and the epitaxial fins 130, as shown in in FIG. 1I. Thereafter, at operation 322, the spacers 160 and the gate electrode 170 are formed on the gate dielectric layer 150, as shown in FIG. 1J. Then, at operation 324, portions of the gate dielectric layer 150 are removed to expose portions of the epitaxial fins 130, as shown in FIG. 1K. Thereafter, at operation 326, the sources/drains 180 are formed on the exposed portions of the exposed epitaxial fins 130 and cover the epitaxial fins 130, as shown in FIG. 1L. In some embodiments, the operation 316 for cleaning the exposed surfaces of the epitaxial fins 130 and the operation 314 for forming the flat surface 140 can be performed at the same tool.

In the above embodiments, because the epitaxial channel structures are hydrophobic, extra wetting agents or surfactants are used at operation for polishing the epitaxial channel structures. However, these wetting agents and surfactants are organic compounds induce visible or non-visible polymer residues and organic particles on the surfaces of the epitaxial channel structures, and severe impact device performance or product yield. Therefore, the method 200 is conducted on a wafer having the epitaxial channel structures to clean exposed surfaces of the epitaxial channel structures. In some embodiments, the method 200 includes an oxidizer rinse operation, contact or non-contact-type cleaning operations and a cleaning cycle operation, thereby efficiently removing the residues and particles from the exposed (polished) surfaces of the epitaxial channel structures.

In accordance with an embodiment of the present disclosure, the present disclosure discloses a method for manufacturing a semiconductor device. In the method for manufacturing a semiconductor device, at first, a semiconductor substrate of a wafer is etched to form at least one fin. Then, an insulation structure is formed around the fin. Thereafter, the fin is recessed. Then, an epitaxial channel structure is epitaxially grown over the recessed fin. Thereafter, a portion of the epitaxial channel structure over a top surface of the insulation structure is removed. Then, a non-contact-type cleaning operation is performed to clean a top surface of the wafer after removing said portion of the epitaxial channel structure. Thereafter, the top surface of the wafer is cleaned using hydrogen fluoride after removing said portion of the epitaxial channel structure. Then, the insulation structure is recessed, such that the epitaxial channel structure protrudes from the recessed insulation structure.

In some embodiments, the non-contact-type cleaning operation includes sonic cleaning the top surface of the wafer.

In some embodiments, the non-contact-type cleaning operation includes spraying a fluid to the top surface of the wafer.

In some embodiments, the non-contact-type cleaning operation includes spinning the wafer.

In some embodiments, the method further includes rinsing the top surface of the wafer using a solution with an oxidizing agent prior to the non-contact-type cleaning operation In some embodiments, the method further includes cleaning the top surface of the wafer using a solution with an oxidizing agent after removing said portion of the epitaxial channel structure.

In some embodiments, the operation for cleaning the top surface of the wafer using hydrogen fluoride is performed prior to cleaning the top surface of the wafer using the solution with an oxidizing agent.

In some embodiments, the operation for cleaning the top surface of the wafer using the solution with an oxidizing agent is performed prior to cleaning the top surface of the wafer using hydrogen fluoride.

In some embodiments, the method further includes rinsing the top surface of the wafer after cleaning the top surface of the wafer using the solution with an oxidizing agent.

In some embodiments, the method further includes rinsing the top surface of the wafer after cleaning the top surface of the wafer using hydrogen fluoride.

In accordance with an embodiment of the present disclosure, the present disclosure discloses a method for manufacturing a semiconductor device. In the method for manufacturing a semiconductor device, at first, a semiconductor substrate of a wafer is etched to form at least one fin. Then, an insulation structure is formed around the fin. Thereafter, the fin is recessed. Then, an epitaxial channel structure is epitaxially grown over the recessed fin. Thereafter, a portion of the epitaxial channel structure over a top surface of the insulation structure, such that a top surface of the other portion of the epitaxial channel structure is exposed from the top surface of the insulation structure. Then, a first non-contact-type cleaning operation is performed to clean the top surface of the other portion of the epitaxial channel structure after removing said portion of the epitaxial channel structure. Thereafter, the top surface of the other portion of the epitaxial channel structure is cleaned using a solution with an oxidizing agent after removing said portion of the epitaxial channel structure. Then, the insulation structure is recessed, such that the epitaxial channel structure protrudes from the recessed insulation structure.

In some embodiments, the operation for cleaning the top surface of the other portion of the epitaxial channel structure using the solution with an oxidizing agent is performed after the first non-contact-type cleaning operation.

In some embodiments, the method further includes rinsing the top surface of the other portion of the epitaxial channel structure prior to performing the first non-contact-type cleaning operation.

In some embodiments, the method further includes performing a contact-type cleaning operation to clean the top surface of the other portion of the epitaxial channel structure after removing said portion of the epitaxial channel structure.

In some embodiments, the method further includes performing a second non-contact-type cleaning operation to clean the top surface of the other portion of the epitaxial channel structure after performing the first non-contact-type cleaning operation.

In accordance with an embodiment of the present disclosure, the present disclosure discloses a method for manufacturing a semiconductor device. In the method for manufacturing a semiconductor device, at first, a semiconductor substrate of a wafer is etched to form at least one fin. Then, an insulation structure is formed around the fin. Thereafter, the fin is recessed. Then, an epitaxial channel structure is epitaxially grown over the recessed fin. Thereafter, a portion of the epitaxial channel structure over a top surface of the insulation structure, such that a top surface of the other portion of the epitaxial channel structure is exposed from the top surface of the insulation structure. Then, the top surface of the other portion of the epitaxial channel structure is cleaned using hydrogen fluoride after removing said portion of the epitaxial channel structure. Thereafter, the top surface of the other portion of the epitaxial channel structure is cleaned using a solution with an oxidizing agent after removing said portion of the epitaxial channel structure. Then, the insulation structure is recessed, such that the epitaxial channel structure protrudes from the recessed insulation structure.

In some embodiments, the method further includes repeating cleaning the top surface of the other portion of the epitaxial channel structure using hydrogen fluoride and cleaning the top surface of the wafer using the solution with an oxidizing agent.

In some embodiments, the method further includes cleaning the top surface of the other portion of the epitaxial channel structure using a brush prior to cleaning the top surface of the wafer using hydrogen fluoride.

In some embodiments, the method further includes cleaning the top surface of the other portion of the epitaxial channel structure using a cleaning pad prior to cleaning the top surface of the wafer using hydrogen fluoride.

In some embodiments, the method further includes cleaning the top surface of the other portion of the epitaxial channel structure using a sponge cleaner prior to cleaning the top surface of the wafer using hydrogen fluoride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
   etching a semiconductor substrate of a wafer to form at least one fin;
   forming an insulation structure around the fin;
   recessing the fin;
   epitaxially growing an epitaxial channel structure over the recessed fin;
   removing a portion of the epitaxial channel structure over a top surface of the insulation structure;
   performing a non-contact-type cleaning operation to clean a top surface of the wafer after removing said portion of the epitaxial channel structure;
   cleaning the top surface of the wafer using hydrogen fluoride after removing said portion of the epitaxial channel structure; and
   recessing the insulation structure such that the epitaxial channel structure protrudes from the recessed insulation structure.

2. The method of claim 1, wherein the non-contact-type cleaning operation comprises sonic cleaning the top surface of the wafer.

3. The method of claim 1, wherein the non-contact-type cleaning operation comprises spraying a fluid to the top surface of the wafer.

4. The method of claim 3, wherein the non-contact-type cleaning operation comprises spinning the wafer.

5. The method of claim 1, further comprising:
   rinsing the top surface of the wafer using a solution with an oxidizing agent prior to the non-contact-type cleaning operation.

6. The method of claim 1, further comprising:
   cleaning the top surface of the wafer using a solution with an oxidizing agent after removing said portion of the epitaxial channel structure.

7. The method of claim 6, wherein cleaning the top surface of the wafer using hydrogen fluoride is performed prior to cleaning the top surface of the wafer using the solution with an oxidizing agent.

8. The method of claim 6, wherein cleaning the top surface of the wafer using the solution with an oxidizing agent is performed prior to cleaning the top surface of the wafer using hydrogen fluoride.

9. The method of claim 6, further comprising:
   rinsing the top surface of the wafer after cleaning the top surface of the wafer using the solution with an oxidizing agent.

10. The method of claim 1, further comprising:
    rinsing the top surface of the wafer after cleaning the top surface of the wafer using hydrogen fluoride.

11. A method for manufacturing a semiconductor device, the method comprising:
    etching a semiconductor substrate of a wafer to form at least one fin;
    forming an insulation structure around the fin;
    recessing the fin;
    epitaxially growing an epitaxial channel structure over the recessed fin;
    removing a portion of the epitaxial channel structure over a top surface of the insulation structure, such that a top surface of the other portion of the epitaxial channel structure is exposed from the top surface of the insulation structure;
    performing a first non-contact-type cleaning operation to clean the top surface of the other portion of the epitaxial channel structure after removing said portion of the epitaxial channel structure;
    cleaning the top surface of the other portion of the epitaxial channel structure using a solution with an oxidizing agent after removing said portion of the epitaxial channel structure; and
    recessing the insulation structure such that the epitaxial channel structure protrudes from the recessed insulation structure.

12. The method of claim 11, wherein cleaning the top surface of the other portion of the epitaxial channel structure using the solution with an oxidizing agent is performed after the first non-contact-type cleaning operation.

13. The method of claim 11, further comprising:
    rinsing the top surface of the other portion of the epitaxial channel structure prior to performing the first non-contact-type cleaning operation.

14. The method of claim 11, further comprising:
    performing a contact-type cleaning operation to clean the top surface of the other portion of the epitaxial channel structure after removing said portion of the epitaxial channel structure.

15. The method of claim 11, further comprising:
    performing a second non-contact-type cleaning operation to clean the top surface of the other portion of the epitaxial channel structure after performing the first non-contact-type cleaning operation.

16. A method, comprising:
    etching a semiconductor substrate of a wafer to form at least one fin;
    forming an insulation structure around the fin;
    recessing the fin;
    epitaxially growing an epitaxial channel structure over the recessed fin;
    removing a portion of the epitaxial channel structure over a top surface of the insulation structure, such that a top surface of the other portion of the epitaxial channel structure is exposed from the top surface of the insulation structure;
    cleaning the top surface of the other portion of the epitaxial channel structure using hydrogen fluoride after removing said portion of the epitaxial channel structure;
    cleaning the top surface of the other portion of the epitaxial channel structure using a solution with an oxidizing agent after removing said portion of the epitaxial channel structure; and
    recessing the insulation structure such that the epitaxial channel structure protrudes from the recessed insulation structure.

17. The method of claim 16, further comprising:
    repeating cleaning the top surface of the other portion of the epitaxial channel structure using hydrogen fluoride and cleaning the top surface of the wafer using the solution with an oxidizing agent.

18. The method of claim 16, further comprising:
    cleaning the top surface of the other portion of the epitaxial channel structure using a brush prior to cleaning the top surface of the wafer using hydrogen fluoride.

19. The method of claim 16, further comprising:
    cleaning the top surface of the other portion of the epitaxial channel structure using a cleaning pad prior to cleaning the top surface of the wafer using hydrogen fluoride.

20. The method of claim 16, further comprising:
cleaning the top surface of the other portion of the epitaxial channel structure using a sponge cleaner prior to cleaning the top surface of the wafer using hydrogen fluoride.

* * * * *